United States Patent [19]
Gorshe et al.

[11] Patent Number: 5,848,065
[45] Date of Patent: Dec. 8, 1998

[54] OPTIMIZED UNIVERSAL CARD SLOT SYSTEM FOR SONET MULTIPLEX EQUIPMENT

[75] Inventors: Steven S. Gorshe, Beaverton; Robert W. Brooks, Jr., Aloha, both of Oreg.

[73] Assignee: NEC America, Inc., Melville, N.Y.

[21] Appl. No.: 584,193

[22] Filed: Jan. 11, 1996

[51] Int. Cl.⁶ ........................................ H04J 3/02
[52] U.S. Cl. .............................. 370/376; 370/539
[58] Field of Search ............................ 370/376, 375, 370/360, 358, 357, 377, 384, 378, 381, 379, 380, 539, 538, 541; 361/600, 728, 729, 730, 731, 733, 736, 737, 748, 752, 784; 639/61, 62

[56] References Cited

U.S. PATENT DOCUMENTS

| | | |
|---|---|---|
| 5,172,306 | 12/1992 | Cantrell . |
| 5,355,362 | 10/1994 | Gorshe et al. ........................ 370/376 |
| 5,497,363 | 3/1996 | Gingell ................................. 370/376 |
| 5,570,364 | 10/1996 | Fujii ..................................... 370/376 |
| 5,583,855 | 12/1996 | Ball ..................................... 370/376 |

*Primary Examiner*—Huy D. Vu
*Attorney, Agent, or Firm*—Sughrue, Mion, Zinn, Macpeak & Seas, PLLC

[57] ABSTRACT

A universal tributary interface group approach for SONET multiplex equipment in which the shelf is partitioned into regions and each region can be provisioned to support different service types. The universal tributary group system includes an equipment shelf having a backplane. The equipment shelf is partitioned into regions called tributary groups which are each capable of accepting tributary units having compatible bus widths and clock rates. Removable card guides may be inserted into the tributary group spaces so that tributary interface units of different heights and widths may be placed in the tributary group spaces. Additionally, a plurality of bus segments run along the backplane to electrically connect a time slot interchange unit to card slots in the tributary groups. Each of the bus segments is capable of being provisioned to use a bus rate compatible with the data requirements of the tributary group it services.

21 Claims, 9 Drawing Sheets

FIG.2A DS1 TRIBUTARY GROUP USAGE

| 1A | 2A | 3A | 4A |
|----|----|----|----|
| 5A | 6A | 7A | PA |

FIG.2B DS3 TRIBUTARY GROUP USAGE

| 1B | 2B | 3B | PB |

FIG.2C OC-1 OR OC-3 TRIBUTARY GROUP USAGE

| 1C | 2C | PC1 | PC2 |

FIG.2D OC-1, OC-3, OR DS3 TRIBUTARY GROUP USAGE

| 1D | PD1 |
|----|-----|
| 2D | PD2 |

FIG.2E OC-12 TRIBUTARY GROUP USAGE

| 1E | PE |

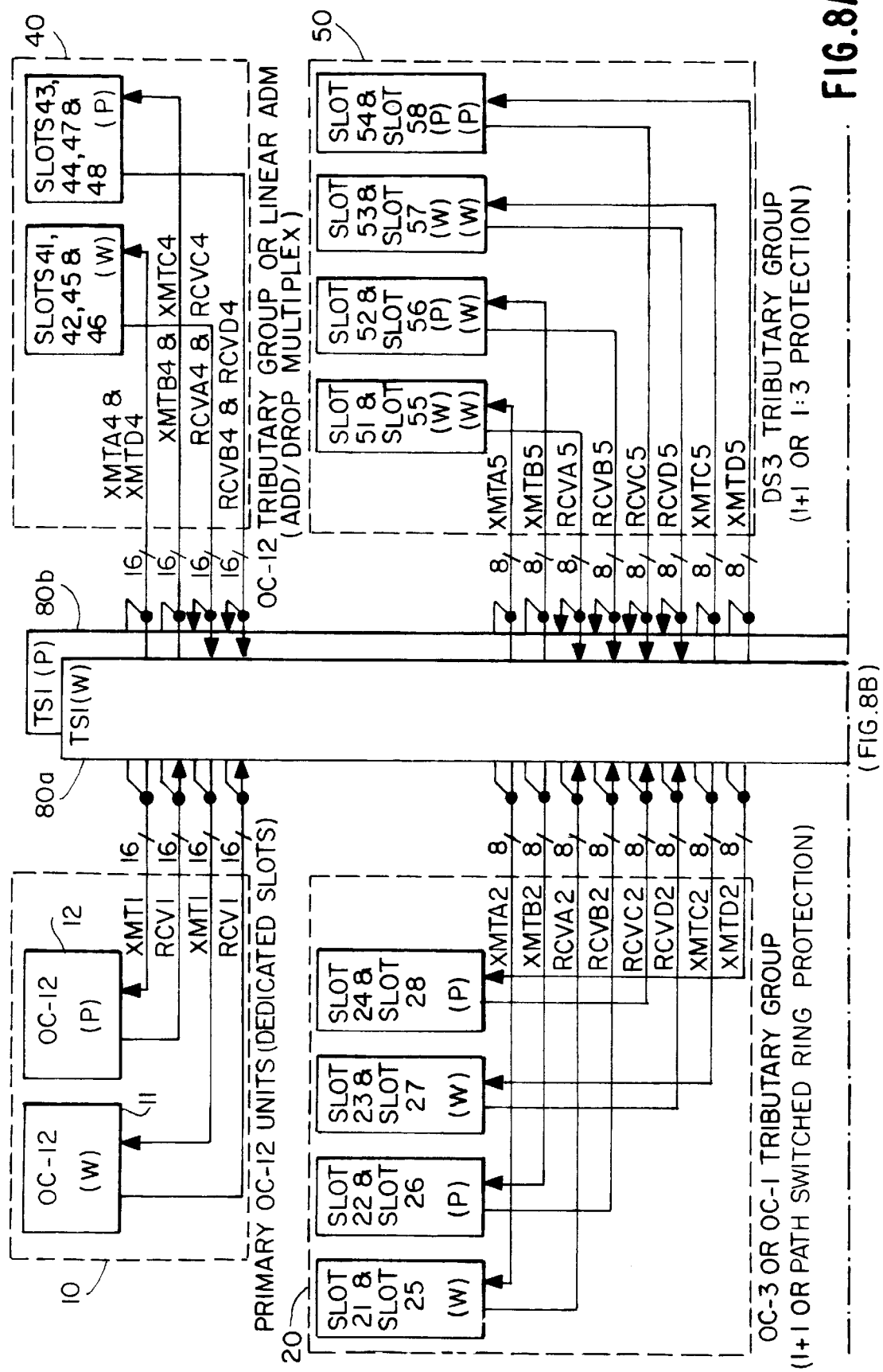

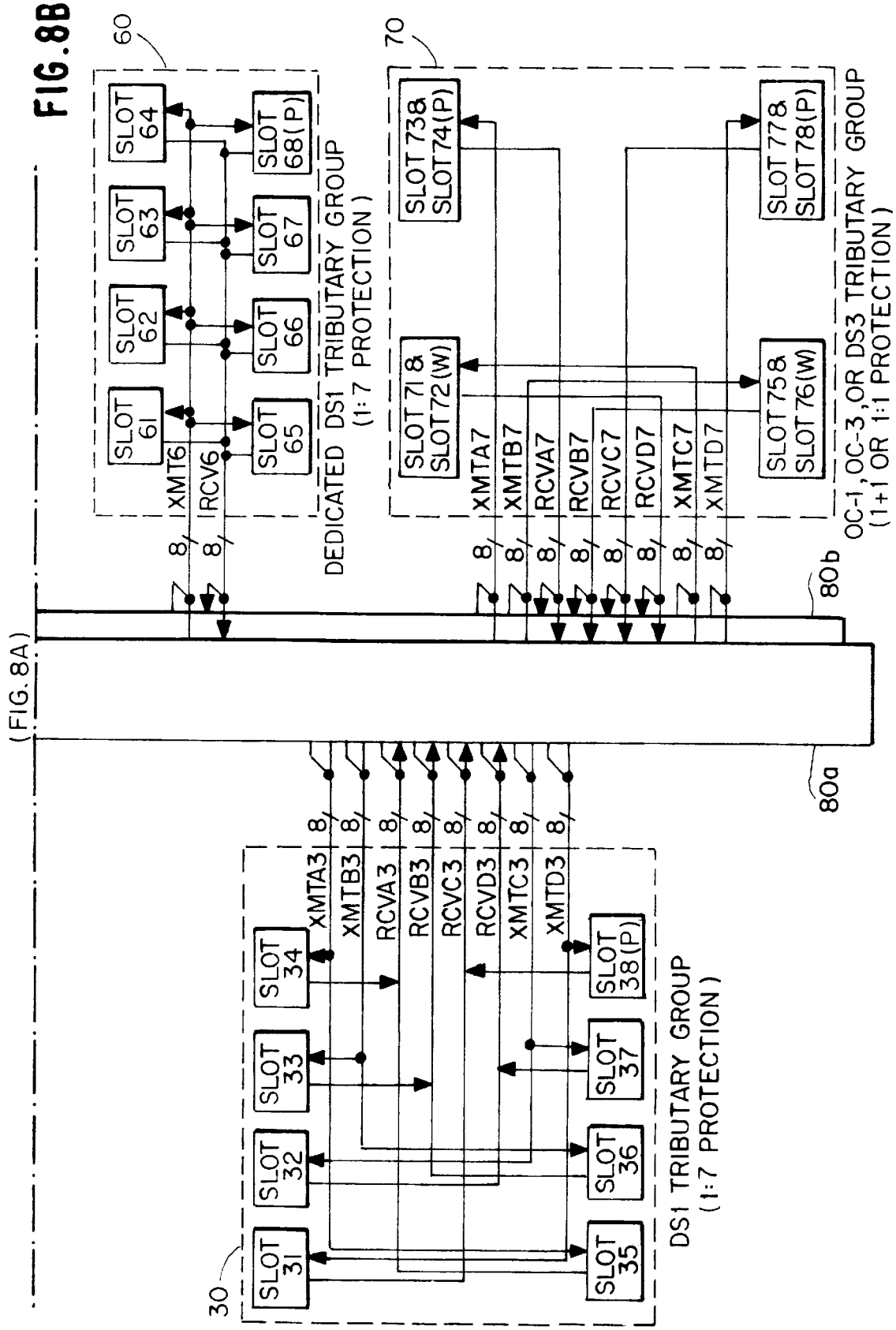

OPTIMIZED UNIVERSAL CARD SLOT SYSTEM FOR SONET MULTIPLEX EQUIPMENT

BACKGROUND OF THE INVENTION

1. Field of the Invention

The present invention relates to a universal tributary interface group system for SONET (Synchronous Optical NETwork) multiplex equipment. More specifically, the present invention relates to a universal tributary interface group system for SONET multiplex equipment which is partitioned into sections and each section can be provisioned to support different service types.

2. The Background Art

The SONET communication hierarchy has been specified by the American National Standards Institute (ANSI) as a standard for a high-speed digital hierarchy for optical fiber. The SONET standard is described in more detail in ANS T1.105 and T1.106, and in Bellcore Technical Recommendations TR-TSY-000253, which are herein incorporated by reference.

SONET multiplex equipment takes lower-rate (tributary) signals, such as DS1 (1.5 Mbit/s), DS3 (45 Mbit/s), OC-1 (51.84 Mbit/s), or OC-3 (155.52 Mbit/s), and time division multiplexes them into a higher-rate signal such as OC-3 or OC-12 (622.08 Mbit/s). The equipment also performs the corresponding demultiplex function of recovering the lower rate tributary signals from an incoming higher-rate signal.

Previous generations of SONET and asynchronous multiplex equipment have dedicated fixed portions of the equipment shelf to different types/rates of services. For example, separate portions of the shelf are typically reserved for DS1, DS3, and OC-3 interface units. Dedicating specific portions of the shelf to specific service types reduces the flexibility of the shelf, and typically leaves wasted shelf space for any given application.

More recently, in order to provide full flexibility and avoid wasting space in the shelf for services that are not used in a given application, universal backplane approaches, such as IEEE P1396 telecommunications bus (COMBUS) and VME, have been adopted. An example of these universal backplane approaches have an adaptable card mounting system for accepting cards of a number of standard dimensions in a shelf independent of slot location, such as that described in U.S. Pat. No. 5,172,306 to Cantrell.

FIG. 9 illustrates a typical COMBUS shelf 900 having a CPU 901, and buses 902–905. In the COMBUS and VME systems, all units share a single set of higher bandwidth buses running to virtually every card slot along the length of the backplane. The tributary interface units all operate at the same bus rate which is high enough to carry the aggregate bandwidth of all tributary interface units on that bus. The P1396 buses traverse the entire backplane and provide an aggregate STS-3 (155.52 Mbit/s) capacity to the units in the shelf in both an upstream and downstream direction. Specifically, four parallel STS-3 capacity buses are used: an add and drop (i.e., transmit and receive) for both upstream and downstream directions. The use of upstream and downstream directions allows add/drop multiplex capability for linear chains or ring networks. All interface units, from DS1 to OC-3, are connected to all four buses, and all card slots are the same physical size (although some units may occupy two adjacent card slots). For OC-12 capacity systems, the four buses must each be capable of STS-12 capacity.

The conventional COMBUS-type approach is limited in that it suffers from a number of drawbacks. Shared bus architectures are vulnerable to bus faults, which either may occur on the system backplane or be caused by a faulted unit connected to the bus. For COMBUS-type systems, a single bus fault can corrupt all the traffic in the system in a given transmission direction unless a redundant protection bus is designed into the system. However, since the faulted unit is also connected to the protection bus, the faulted unit may additionally corrupt the protection bus. Thus, even a redundant bus leaves some vulnerability to single faults.

The largest drawback to conventional universal bus approaches is that the unit sizes must be chosen to accommodate the largest tributary interface units. Typically, units are 6U–7U high. (1U=one rack unit=1.75 in.) Generally, COMBUS-type systems package 14 DS1 interfaces on a single unit to achieve efficient packing density. However, having 14 DS1's per unit is bad from the standpoint of modularity, including initial installment cost and incremental growth. When a single, protected DS1 is required, 28 DS1 circuits must be installed (14 on the working interface unit and 14 on the protection interface unit). Since COMBUS-type systems typically use 1+1 protection for DS1 units, each time the number of required DS1 interfaces grows beyond a multiple of 14, an additional 28 circuits must be installed with the next DS1 interface unit and its protection unit. A similar situation exists for DS3 units where COMBUS systems typically package multiple DS3 interface circuits on a single interface unit.

Another drawback of the conventional devices is that the size of the backplane connector limits the size of the system. Each unit in the OC-3 COMBUS systems connects to four buses, each 19.44 MHz×8 bits wide, for a total of 32 bus signal connections. To expand to an OC-12 system with the same bus clock rate, four 32-bit buses are needed for a total of 128 bus signal connections per unit plus an additional 16–24 power/ground connections. Alternatives such as using four-bit wide buses at 38.88 MHz are feasible for reducing the number of bus signal connections, but require bus transceiver logic that significantly increases the system power requirement. At 38.88 MHz, bipolar trapezoidal drivers are required, while at 19.44 MHz lower-power bipolar/CMOS hybrid (biCMOS) logic can be used. To support 112 DS1 interfaces, a COMBUS-type system with four-bit-wide 38.88 MHz buses will consume approximately 40 watts more power than a system using biCMOS bus logic at 19.44 MHz. Moreover, each unit requires 68–85 connections associated with the DS1 electrical connections, and many other signals for control of the PCM buses and for intrashelf communications.

Additionally, all COMBUS buses run at the STS-3 capacity (19.44 MHz×8 bits wide=155.52 Mbit/s). For an OC-3 system, then, each unit must connect to 32 bus signals (8 transmit, 8 receive, and 16 bidirectional). Bus speeds at these rates typically require bipolar or bipolar/CMOS hybrid (biCMOS) bus logic. For an OC-12 system, either buses must be expanded to a 32 bit width, or the bus clock rate must be increased. If the buses are expanded, then for the same 19.44 MHz bus rate, each unit must have 128 bus signal connections. Alternatively, increasing the clock rate for such high-capacitance buses require very high-performance, high-current drive bus logic.

Another drawback of the conventional device is the complexity of control. In a COMBUS-type system, the time-slot assignment/interchange function is distributed among all the tributary interface units in the shelf. Protection switching functions are also distributed among the working and protection units. Shared bus systems must pass messages to coordinate between the working and protection OC-N units to determine which unit is providing data to the bus. For time slot interchange, map provisioning in a COMBUS-type system involves communicating the time slot map information to all affected interface units. This level of distributed processing requires high-speed and relatively complex communications among the units in the system.

Another drawback of the conventional device is reduced capacity for supporting some types of network technologies. If many signals are being crossconnected between the tributary interface units instead of being placed onto the high-speed line units, the backplane capacity of COMBUS-type shelf can be quickly consumed. Consider the example of FIG. 9 where units w and y exchange STS-1 number 1, and units x and z also must exchange STS-1 number 1. Data received by a tributary interface unit is placed onto a drop bus in the appropriate time slot. Interconnection (crossconnecting) between tributary interface units in a COMBUS system is performed by having both units place their received data onto the add buses, with one unit using the add bus 902 and the other unit using the west add bus 904. In this example, units w and y have already used the STS-1 number 1 time slot for both drop buses. Units x and z can only interconnect if they shift STS-1 number 1 to a different time slot (assuming one is available).

Similarly, 1+1 linear and ring path protection switching must have the working and protection interface units arbitrate for which provides the data to the backplane. Attempting to place the data from both OC-N units onto the backplane would quickly consume all the bandwidth. Thus, the COMBUS-type architecture inherently limits the amount of crossconnect functions that can be performed and complicates the path switched ring implementation for the drop side of the multiplex node.

BRIEF SUMMARY OF THE INVENTION

Accordingly, it is an object of the present invention to provide a universal interface group approach for SONET multiplex equipment which is free of the above-mentioned problems.

It is also an object of the present invention to provide flexibility to the user of the equipment, by having different types of tributary interface units share the same physical mounting space in an equipment shelf, rather than having a unique mounting location for each type of tributary interface unit. This invention allows a very high degree of universal tributary space usage by dividing the equipment shelf into tributary groups, each of which can accept any type of tributary interface unit. Moreover, removable card guides are provided so that tributary interface units of different heights may be placed in the tributary group spaces. However, the sharing of each tributary group space is limited to certain unit types.

It is a further object of the present invention to provide a plurality of bus segments that run along the backplane of the equipment shelf. Each of the bus segments connect the time slot interchange (TSI) unit with the tributary interface units. Each of these bus segments is capable of being provisioned to use a bus rate compatible with the data requirements of the tributary group it services.

In accordance with the above and other objects of the present invention, the overall system power consumption is reduced over the conventional universal mounting space approaches. Additionally, highly flexible use of space for different tributary interface types allows for a more compact system that supports a higher degree of tributary interface mixes than systems with dedicated areas for each tributary interface type. Further, the bus structure of the backplane allows efficient partitioning and implementation of SONET multiplex/demultiplex functions, the flexibility to support ring networks from the tributary interface units, efficient support of time slot interchange, and increased modularity for converting from lower rate to higher rate systems. Finally, the system is inherently fault secure because the bus segments are structured such that all units requiring a 1+1 or path switched ring protection have a unique connection to the time slot interchange unit.

The above and other objects of the invention are accomplished by a universal tributary group system for SONET multiplex equipment using tributary interface units having an equipment shelf being partitioned into tributary groups having slots for holding the tributary interface units. The slots accept tributary units of a predetermined service type for the respective tributary group. A time slot interchange unit, which is located in the equipment shelf, is electrically connected with the slots of the tributary groups via a plurality of bus segments. Each of the bus segments is provisioned to use a bus rate compatible with the data requirements of the tributary group it services.

BRIEF DESCRIPTION OF THE DRAWINGS

The foregoing and other objects, aspects, and advantages will be better understood from the following detailed description of the invention with reference to the drawings, in which:

FIGS. 2A to 2E illustrate examples of tributary interface group layouts.

FIG. 8 illustrates an example PCM logical bus configuration of a shelf.

DETAILED DESCRIPTION OF THE INVENTION

Referring to the accompanying drawings, preferred embodiments of the present invention will be described in detail.

1. SHELF CONFIGURATION

Figure 1:
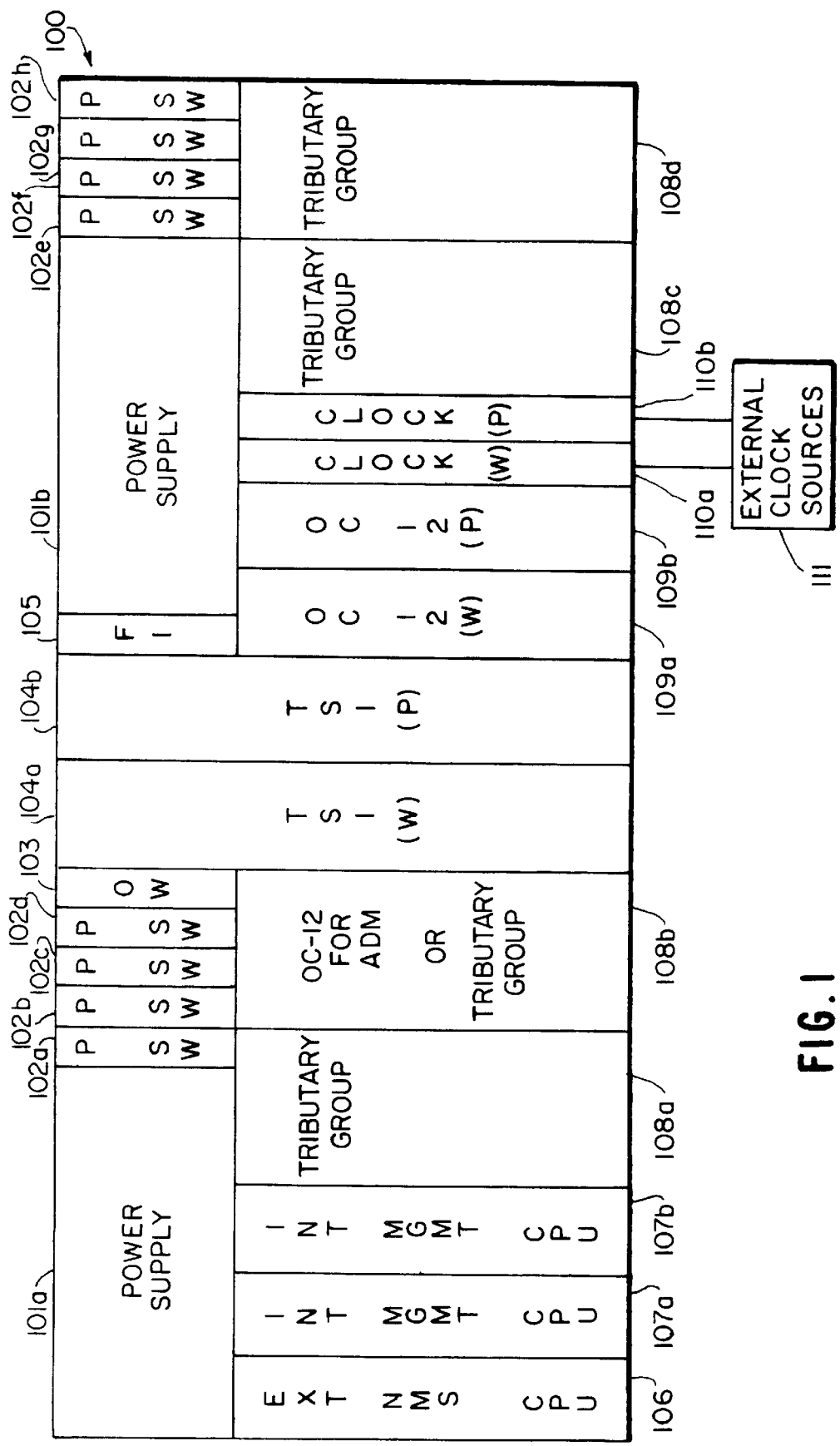
FIG. 1 illustrates a shelf layout with four universal tributary groups according to a preferred embodiment of the present invention.

FIG. 1 illustrates an example of a shelf configuration with four universal tributary groups. The shelf 100 includes power supplies 101a, 101b, protection switches (P SW) 102a–102h, an order wire (OW) 103 for troubleshooting, a working time slot interchanger (TSI) 104a and a protection TSI 104b (hereinafter generally identified with reference numeral 104), data port F1 105, external network management system CPU (EXT NMS CPU) 106, internal management CPUs (INT MGMT CPU) 107a, 107b, a working clock 110a, and a protection clock 110b (hereinafter generally identified with reference numeral 110). The function of the EXT NMS CPU 106 is to perform message routing and network interfacing. The INT MGMT CPU 107a, 107b carries out shelf control, diagnostic functions, provisions parameter settings of the other units in the shelf, and determines which interface units are inserted into the tributary groups 108a–108d in the shelf 100. The clock unit 110 is responsible for selecting and filtering the clock signals received from the various tributary units, external clock sources 111, and the internal oscillators, and distributing the clocks to the TSI unit 104 and tributary interface units located in the tributary groups 108a–108d.

The universal interface group approach of the present invention divides part of the shelf 100 into regions called tributary interface groups 108a–108d. Each interface group 108a–108d supports services that have similar unit sizes and protection requirements. While FIG. 1 illustrates four tributary interface groups, the invention is not limited to this number of groups. The actual number of tributary interface groups of the system depends upon shelf implementation.

One interface group in the shelf 100 is always dedicated to the primary OC-12 interface function, i.e. passing data to the tributary interface units in the shelf 100. The two OC-12 units 109a (working), 109b (protection) sharing this dedicated group space allow point-to-point and two-fiber ring topology implementations. For linear add/drop multiplex applications, a second set of OC-12 units is required. The tributary interface group 108b physically closest to the TSI unit 104 is designated as the preferred location for this second set of OC-12 units. Otherwise, any tributary interface group can be used for any interface unit type.

Some interface unit types can be mixed within the same tributary interface group. In order to share a tributary interface group, interface units must be compatible with respect to their PCM bus width and clock rates. The TSI unit 104 establishes the PCM bus clock rate for each tributary interface group.

Virtually all time-slot assignment/interchange and protection decisions are performed locally on the TSI unit 104. Thus, control is simplified and the amount of intra-shelf messages is greatly reduced. This typically in turn reduces the time required for protection switching and reduces the overall complexity and cost of the system.

2. TRIBUTARY INTERFACE GROUPS

Since DS1 is the smallest bandwidth tributary interface and is a frequently used application, the shelf can be optimized for DS1. Four DS1 interface circuits on a single interface unit has been commonly regarded as an ideal number. Four DS1 interfaces may be easily implemented on a 2U unit, or a 3U unit if per-unit power supplies are used. In general, if y is the optimum size for a unit with four DS1 interface circuits, then y, 2y, and 4y are preferred sizes for single DS3, OC-3, and OC-12 units, respectively.

FIGS. 2A–2E illustrate examples of tributary interface group layouts, where each example tributary interface group is four card slots wide. There are four different interface unit sizes permitted for this example: half the height of the group space by one slot (e.g., for DS1 interface units) illustrated in FIG. 2A, the full height of the group space by one slot (e.g., for DS3, OC-1, or OC-3 interface units) illustrated in FIGS. 2B and 2C, half the height of the group space by two slots (e.g., for DS3, OC-1, or OC-3 interface units) illustrated in FIG. 2D, and the full height of the group space by two slots (e.g., for OC-12 interface units) illustrated in FIG. 2E.

The tributary group illustrated in FIG. 2A includes slots 1A–7A for working interface units and slot PA for a protection interface unit (1:7 protection). The tributary group illustrated in FIG. 2B includes slots 1B–3B for working interface units and slot PB for a protection interface unit (1:3 protection). The tributary group illustrated in FIG. 2C includes slots 1C and 2C for working interface units, and slots PC1 and PC2 for protection interface units (1+1 protection). The tributary group illustrated in FIG. 2D includes slots 1D and 2D for working interface units and slots PD1 and PD2 for a protection interface units (1+1 or 1:n protection). Finally, the tributary group illustrated in FIG. 2E includes slot 1E for a working interface unit and slot PE for a protection interface unit.

To allow the 2U high units to be placed in the group space, a removable card guide, described in more detail below, is inserted to vertically partition the tributary interface group into two rows of four slots, as shown in FIGS. 2A and 2D. The removable card guides may be installed or removed in the field to configure the system without disrupting service in the other interface groups. Of course, the OC-3 and OC-12 units could be implemented by stacking multiple printed circuits boards (PCB) into a wider unit, but the inter-PCB connections required for stacking increases the overall cost of the unit and complicates its design.

In the preferred embodiment, the removable card guides are four card slots wide, the width of the tributary group space, and the tributary interface units may be any of the four sizes illustrated in FIGS. 2A–2E. However, it is to be understood that the removable card guides, the tributary group spaces, and the tributary interface units are not limited to these sizes.

3. REMOVABLE CARD GUIDES

Figure 3:
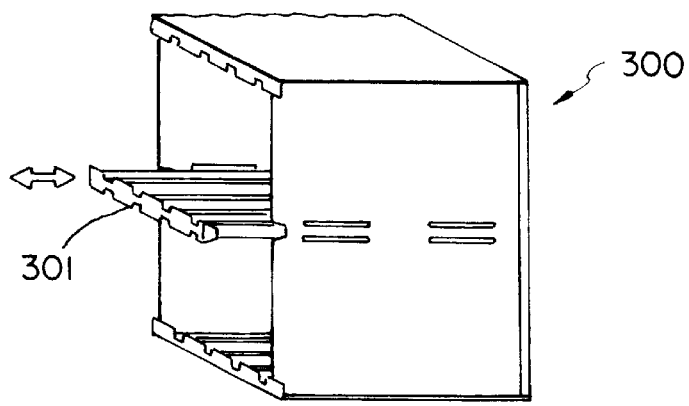
FIG. 3 illustrates a removable card guide for an interface group.

FIG. 3 illustrates a removable card guide for an interface group. The removable card guide 301 may be placed in any tributary interface group space 300 to partition the group space 300 into two rows. As a result, the tributary interface group space 300 can accept tributary interface units which are half the height of the group space 300.

Figure 4A:
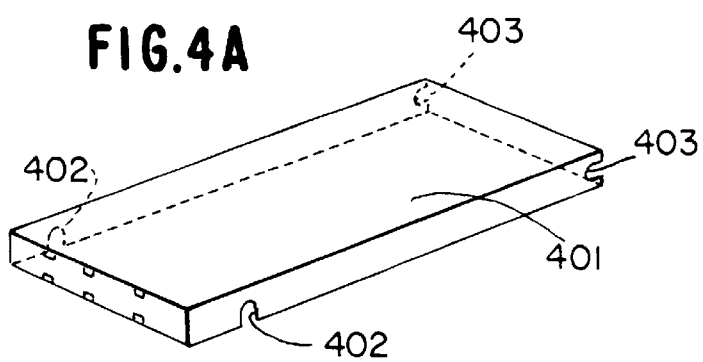
FIGS. 4A to 4C illustrate a removable cardguide for use with permanent fixed vertical supports.
Figure 4B:
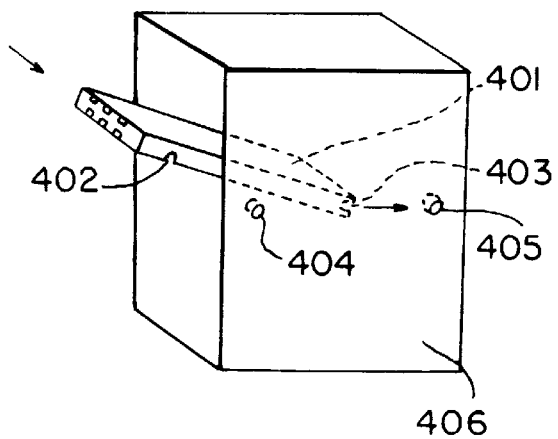
Figure 4C:
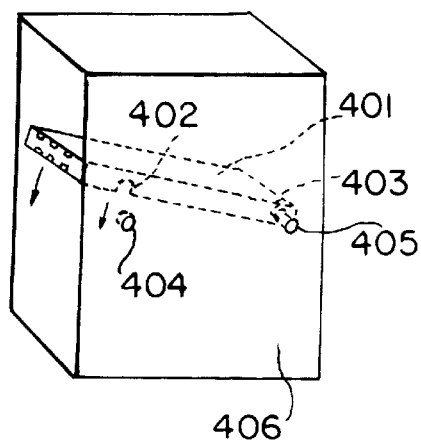

Three examples of removable card guides, to be described in detail in the following sections, are illustrated in FIGS. 4A to 4C, 5A to 5B, and 5C to 5D, with the example of FIGS. 4A to 4C being the preferred version from the standpoint of mechanical stability. While the following three examples of removable card guides partition the tributary group spaces such that each of the tributary group spaces accept tributary interface units having the same height as one another, it is to be understood that the removable card guides may also be designed to partition the tributary group spaces such that each of the tributary group spaces may accept tributary interface units having different heights from one another.

3.A. CARD GUIDE FOR USE WITH PERMANENT FIXED VERTICAL SUPPORTS

FIGS. 4A to 4C illustrate a removable cardguide for use with permanent fixed vertical supports. The cardguide 401 has two side slots 402 and two rear slots 403. Additionally, permanent vertical supports (i.e., side sticks 404 and rear sticks 405 which correspond to the side slots 402 and rear slots 403, respectively) are installed in the shelf at the edge of each tributary interface group space 406. A single support may be shared by adjacent tributary interface groups.

To install the cardguide 401 into the tributary interface group space 406, two actions are required. First, as illustrated in FIG. 4B, the rear-hole-end of the card guide 401 is inserted into the tributary interface group space 406 such that the rear slots 403 of the card guide 401 are secured onto the rear sticks 405. Second, as illustrated in FIG. 4C, the side-hole-end of the card guide 401 is lowered such that the side slots 402 of the card guide 401 are suspended on side sticks 404. Removable cardguide 401 provides the upper card guides for the lower row of units, and the lower cardguide for the upper row of units.

3.B. CARD GUIDE WITHOUT PERMANENT FIXED VERTICAL SUPPORTS

FIGS. 5A to 5D illustrate removable cardguides 502 and 511 which do not have permanent fixed vertical supports. More specifically, cardguide 502 does not have any vertical supports, and cardguide 511 has vertical supports which are not permanent. As with the card guide with permanent fixed vertical supports described above, cardguides 502 and 511 provide the upper card guides for the lower row of units, and the lower cardguide for the upper row of units.

3.B.1. CARD GUIDE WITH NO VERTICAL SUPPORTS

Figure 5A:
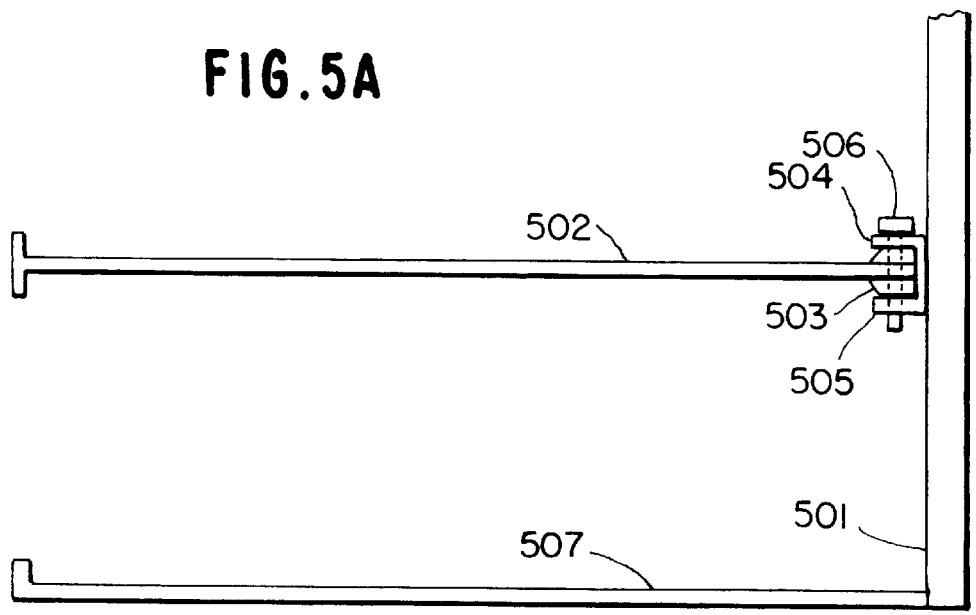
FIG. 5A illustrates a side view of a removable cardguide without vertical supports.
Figure 5B:
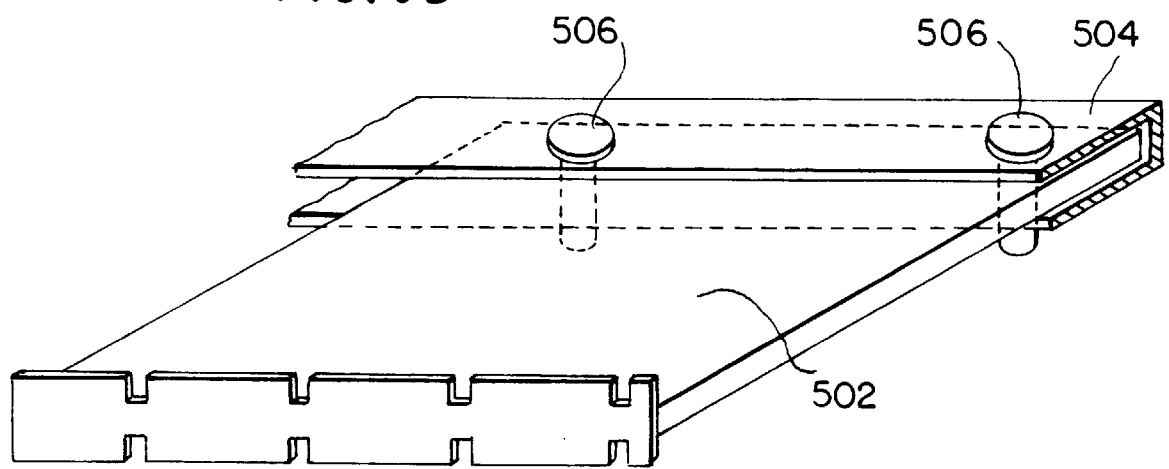
FIG. 5B illustrates a front view of a removable cardguide without vertical supports.

FIGS. 5A and 5B illustrate a cardguide which has no vertical supports. To install cardguide 502 into a tributary group space having fixed bottom card guides 507, an end of the cardguide 502 having insertion holes 503 is inserted into a key/stiffening bar 504 located on the backplane 501 of the shelf so that holes 503 of cardguide 502 line up with holes 505 of key-stiffening bar 504. Pins or screws 506 are then inserted through both insertion holes 503 in the cardguide 502 and holes 505 in the key/stiffening bar 504 in order to secure the removable card guide 502 to the backplane 501.

3.B.2. CARD GUIDE WITH NON-PERMANENT VERTICAL SUPPORTS

Figure 5C:
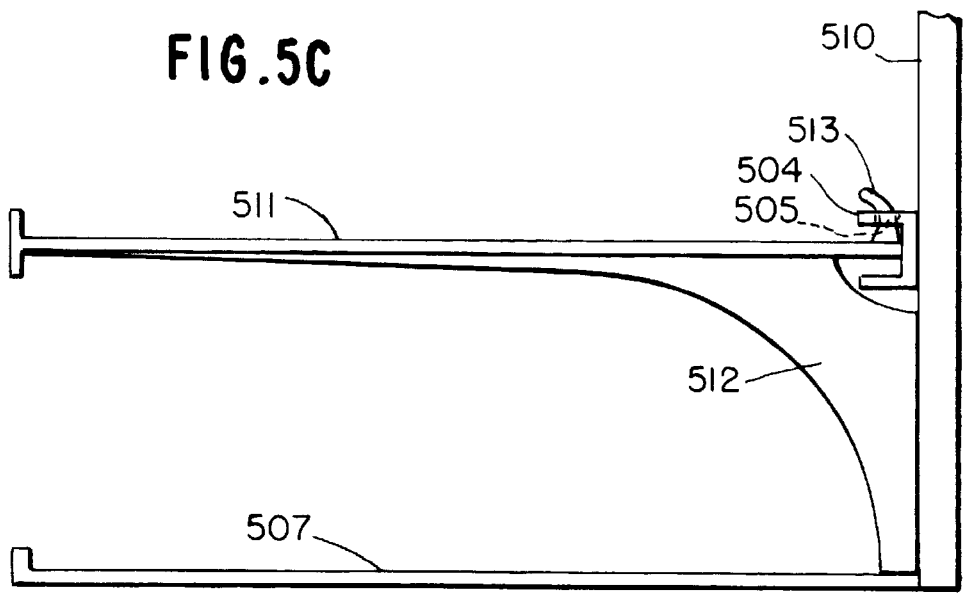
FIG. 5C illustrates a side view of a removable cardguide with non-permanent fixed vertical supports.
Figure 5D:
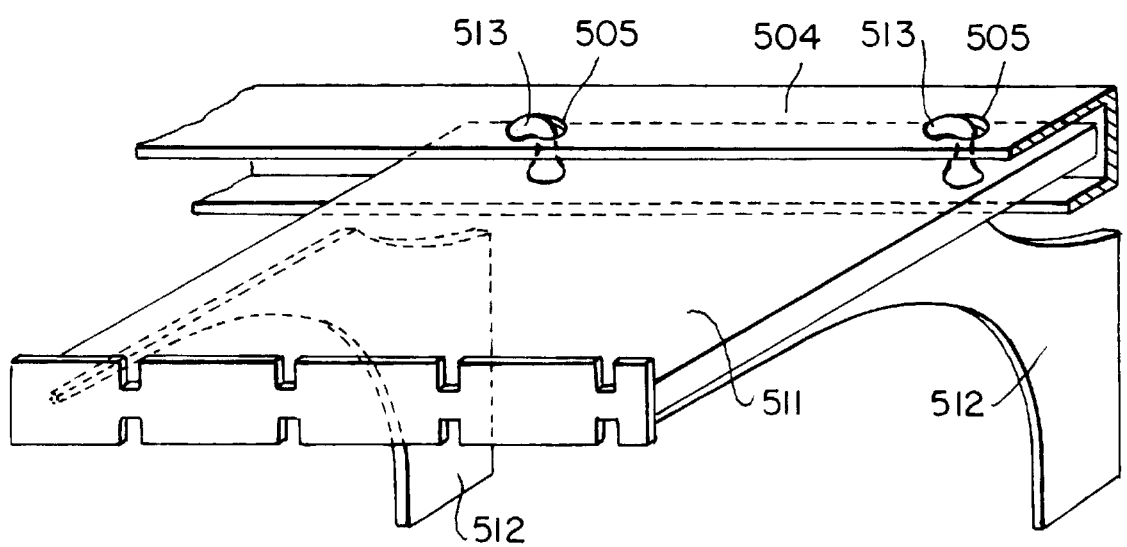
FIG. 5D illustrates a front view of a removable cardguide with non-permanent fixed vertical supports.

FIGS. 5C and 5D illustrate a cardguide which has non-permanent vertical supports. The cardguide 511 has hooks 513 located on the same end of the cardguide 511 as vertical supports 512.

To install cardguide 511, two actions are required. First, the cardguide 511 is inserted into the tributary interface group space such that hooks 513 are inserted into the upper holes 505 of the keying/stiffening bar 504 from the underside thereof. Second, the end of the card guide 511 opposite the hooks 513 is lowered such that the vertical supports 512 are caused to rest on the backplane 510 of the shelf.

4. BUS ARCHITECTURE

Figure 6:
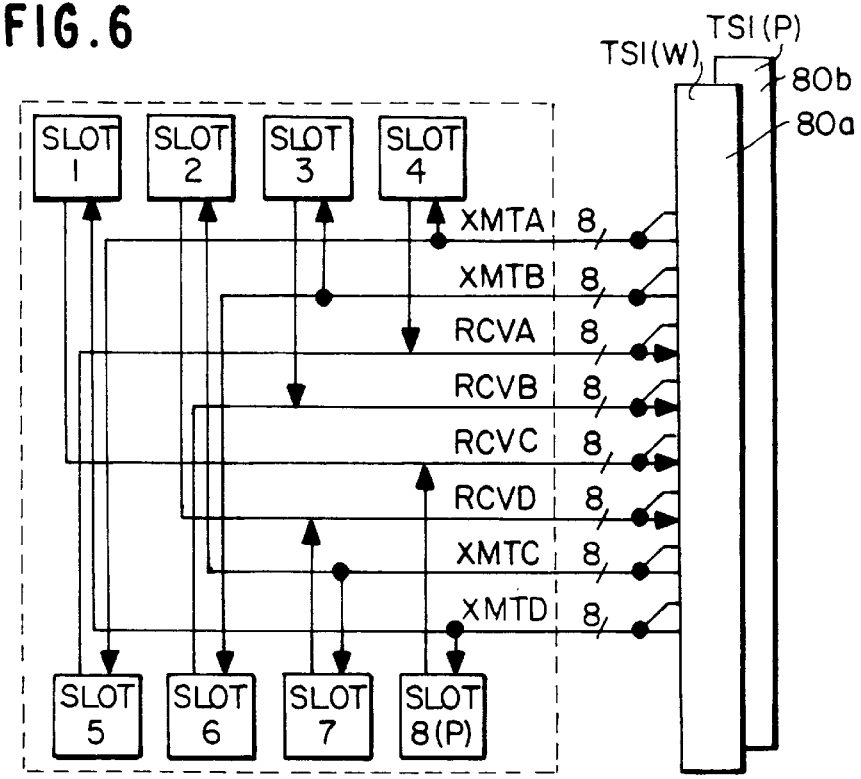
FIG. 6 illustrates the bus layout of the universal tributary interface groups.

FIG. 6 illustrates the bus layout of the universal tributary interface groups. Each universal tributary group space has eight card slots (1–8) for accepting tributary interface units. Eight 8-bit bus segments (XMTA, XMTB, RCVA, RCVB, RCVC, RCVD, XMTC, XMTD) which are routed on the backplane connect the working and protection TSI units 80a, 80b (hereinafter generally identified with reference numeral 80) to the eight card slots as follows: XMTA to card slots 4 and 5, XMTB to card slots 3 and 6, XMTC to card slots 2 and 7, XMTD to card slots 1 and 8, RCVA to card slots 4 and 5, RCVB to card slots 3 and 6, RCVC to card slots 1 and 8, and RCVD to card slots 2 and 7. Both the working TSI unit 80a and the protection TSI unit 80b are connected to the same buses.

The format of each PCM bus segment is based on the SONET signal format. For example, the byte alignment on the PCM bus segments corresponds to the byte alignment of the SONET signal format, and the data bytes are sent in a format that corresponds directly with the byte sequence of a SONET signal.

Figure 7:
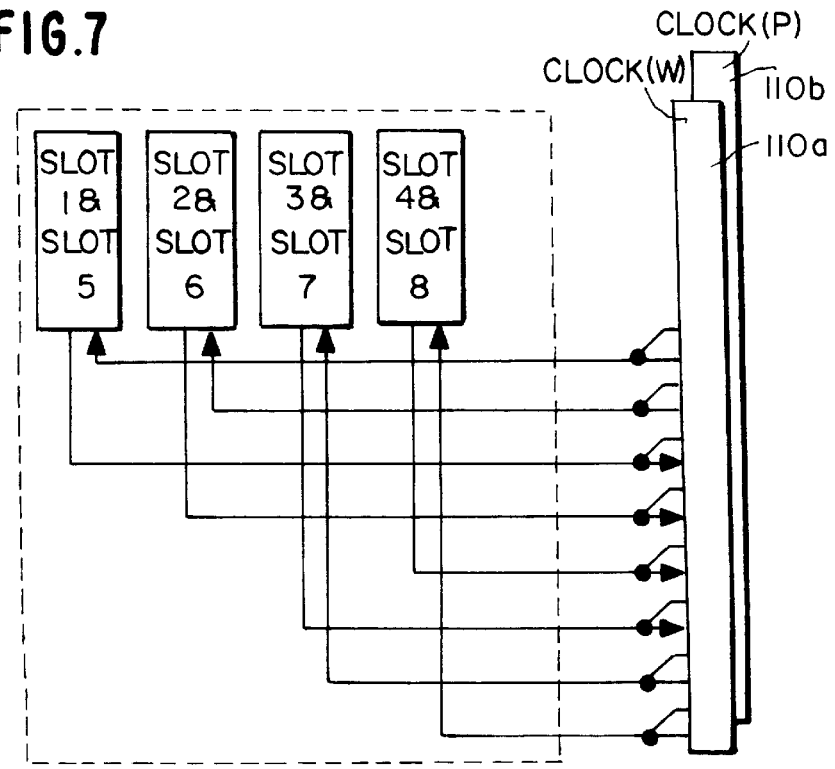
FIG. 7 illustrates the connections between the clock and the tributary interface groups.
Figure 9:
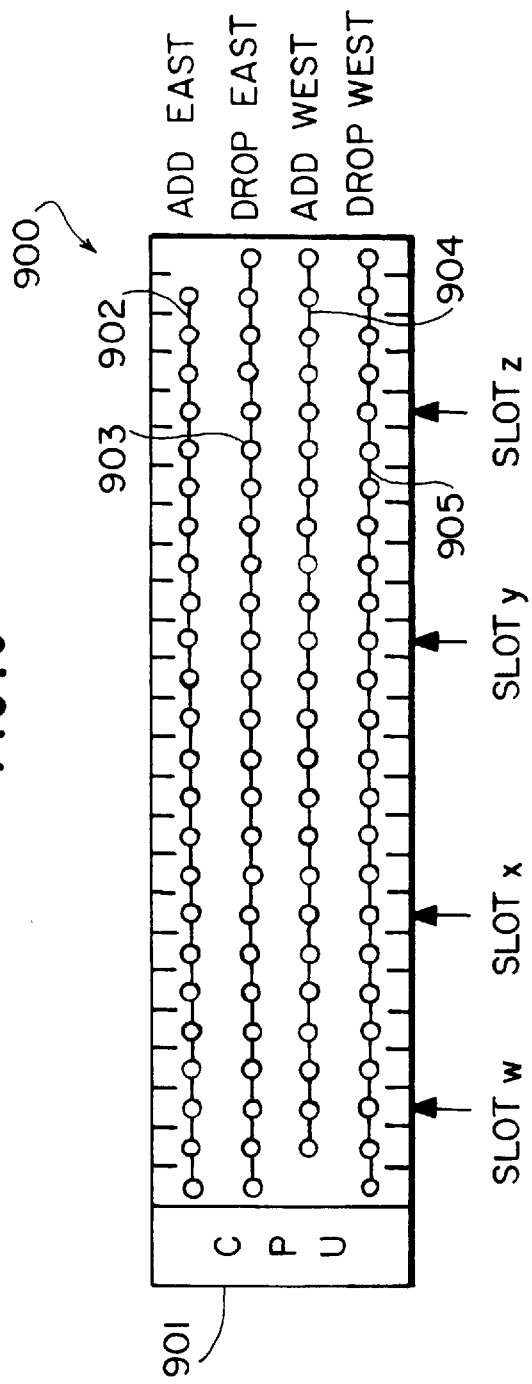
FIG. 9 illustrates a conventional COMBUS shelf and bus architecture.

As illustrated in FIG. 7, each two-connector high card slot has a unique path along the backplane to the clock unit 110 also illustrated in FIG. 1. (This is also true of two-connector wide card slots.) One connection sends the clock recovered from an incoming span via a tributary interface unit to the clock unit 110, and the other connection sends a clock signal to an outgoing span from the clock unit 110 via a tributary interface unit. This unique set of clock signals between each two-connector high card slot and the clock unit 110 allows any of the available clock sources (i.e. any clock recovered from the spans of the individual interface units, an external clock source (see 111 in FIG. 1), or a local oscillator in the clock unit 110) to be used to transmit data from any of the tributary interface units. This design is advantageous in that it allows interconnecting networks to maintain their own unique timing references. Without these unique connections, the only clock sources which can be used to transmit data over a specific span from a tributary interface unit are the reference clock for the intra-shelf PCM buses (which was chosen from among the clocks recovered from the individual interface units, an external clock source, and the local oscillator in the clock unit 110), and the clock which was previously recovered from the specific span when the information was received.

Each PCM bus segment in the system operates at a rate that is an integer divisor of the SONET STS-12 rate of 622.08 Mbit/s, the rate of the primary optical interface for the system. The bus rate and bus width for the bus segments in each tributary group can be provisioned through a computer interface to the system controller 107a, 107b illustrated in FIG. 1, or may be set automatically by the system controller 107a, 107b after it detects which service type of unit is installed in the group.

For lower data rate tributary applications, such as DS1 service, the tributary interface units use 8-bit bus segments with a 6.48 MHz clock such that the bus segments have a bandwidth equal to that of an STS-1 signal. For higher data rate tributaries such as DS3 or OC-3, the tributary interface units use 8-bit bus segments with a 19.44 MHz clock such that the bus segments have a bandwidth equal to that of an STS-3 signal. OC-12 interface units use 16-bit bus segments with a 38.88 MHz clock such that the bus segments have a bandwidth equal to that of an STS-12 signal.

FIG. 8 illustrates an example PCM logical bus configuration of a shelf. Interface groups are enclosed by ghost lines. Examples of different types of interface group configurations 10, 20, 30, 40, 50, 60, 70 are shown. However, the tributary interface groups illustrated in FIG. 8 are not limited to these specific types of units and protection (to be further described below). Interface groups 20, 30, 40, 50, 70 are examples of the universal tributary interface groups of the subject invention. Interface groups 10 and 60 are dedicated to a specific type of interface. The bus configurations of tributary interface groups 20, 30, 40, 50, and 70 will now be described with reference to FIGS. 6–8.

Interface units whose dimensions are half the height of the tributary group space by one slot unit wide, e.g. DS1 or DS3, may be placed in any of slots 1–8 illustrated in FIG. 6. Thus, eight of these interface units may be placed in a tributary group space. Each card slot shares its transmit and receive bus segments with one other nonadjacent card slot in that tributary interface group. The result is that each pair of vertical card slots has a unique transmit and receive bus segment connection to the TSI unit 80. More specifically, the two tributary interface units placed in slots 4 and 5, 3 and 6, 2 and 7, or 1 and 8 share 8-bit transmit and receive bus segments on a time slot basis to the TSI unit 80. (For example, each DS1 unit would be assigned up to four virtual tributaries (VTs) within the SONET signal, and it places its PCM data onto the bus segment during the time slots associated with those VTs in the SONET-organized receive bus segment.) For example, DS1 tributary interface group 30 illustrated in FIG. 8 is capable of accepting 8 DS1 tributary units in slots 31–38. The tributary units in slots 31–38 are connected to the TSI unit 80 by eight 8-bit bus segments XMTA3, XMTB3, RCVA3, RCVB3, RCVC3, RCVD3, XMTC3, XMTD3, with two card slots connected to a single bus segment. More specifically, tributary interface group 30 has slots 34 and 35 connected to XMTA3, slots 33 and 36 connected to XMTB3, slots 34 and 35 connected to RCVA3, slots 33 and 36 connected to RCVB3, slots 31 and 38 connected to RCVC3, slots 32 and 37 connected to RCVD3, slots 32 and 37 connected to XMTC3, and slots 31 and 38 connected to XMTD3.

Since the DS1 tributary units share the 8-bit PCM bus segments on a time slot basis, the TSI unit 80 combines RCVA3, RCVB3, RCVC3, and RCVD3 bus segments into a single logical bus within the TSI unit 80. In the transmit direction, the TSI unit 80 broadcasts the entire STS-1 signal to all the DS1 units over the XMTA3, XMTB3, XMTC3, and XMTD3 bus segments. Alternatively, the TSI unit 80 may transmit only those bytes on each bus that are required by a unit on that bus (e.g., bus XMTA3). This alternative requires additional control logic in the TSI unit 80, but lowers system power consumption by only transmitting data on bus segments when necessary.

DS1 tributary interface group 30 has 1:7 protection. In other words, a protection interface unit inserted in slot 38 can substitute for any of seven tributary interface units inserted in slots 31–37 should a fault occur in any of the seven units.

Interface units whose dimensions are the full height of the tributary group space by one card slot wide, e.g. OC-1, OC-3, or DS3, take up the space of two card slots and may be placed in any of the following pairs of slots illustrated in FIG. 6: 1 and 5, 2 and 6, 3 and 7, and 4 and 8. These particular slot pairings are chosen because each of these pairs uses a single printed circuit board. Thus, four of these tributary interface units may be placed in a single tributary group space. Since the bus segments from only one of the card slots of the pair are required to supply each of these interface units, these units connect only to the bus segments of the bottom card slots. Alternatively, the units could connect to the bus segments of the top card slots. As a result, each interface unit has a unique set of 8-bit transmit and receive bus segments connecting it with the TSI unit 80.

For example, OC-3 or OC-1 tributary interface group 20 illustrated in FIG. 8 has eight card slots 21–28 and is capable of accepting four OC-3 or OC-1 tributary interface units. One tributary interface unit may be placed in any of the following pairs of slots 21 and 25, 22 and 26, 23 and 27, and 24 and 28. Eight 8-bit bus segments connect the card slots to the TSI unit 80. Since the bus segments of the bottom card slot is used in the example, slot 25 is connected to XMTA2 and RCVA2, slot 26 is connected to XMTB2 and RCVB2, slot 27 is connected to XMTC2 and RCVD2, and slot 28 is connected to XMTD2 and RCVC2. Thus, each tributary interface unit has its own transmit and receive bus segment connections, and the bus segments of the bottom card slots 25–28 are used while top card slots 21–24 remain unused.

Tributary interface group 20 uses either 1+1 or path-switched ring protection. With 1+1 protection there is both a working and a protection tributary interface unit. The same data is transmitted on the bus segments connected to the working unit and the bus segments connected to the protection unit, and the receiving system chooses the best of the two received signals. With path switched ring protection, the same data is transmitted in both directions around the ring. The use of unique bus segment connections from the TSI unit 80 to the tributary interface units allows the TSI unit to perform all of the protection functions associated with 1+1 and path switched ring protection, thereby resulting in simplified control. Moreover, the use of unique bus segment connections allows the implementation of the drop and continue function necessary to interconnect rings at multiple nodes. (A drop and continue connection is one in which the data for a tributary enters the ring at one node, but is dropped at multiple nodes.)

As another example of tributary units whose dimensions are the full height of the group space by one card slot wide, DS3 tributary interface group 50 is capable of accepting four DS3 tributary interface units. Eight bus segments connect the tributary interface units to the TSI unit 80, with each tributary interface unit having its own transmit and receive bus segment connections. DS3 tributary interface group 50 has the same logical bus configuration as tributary interface group 20. One tributary interface unit may be placed in any of the following pairs of slots 51 and 55, 52 and 56, 53 and 57, and 54 and 58. Eight 8-bit bus segments connect the card slots to the TSI unit 80. More specifically, slot 55 is connected to XMTA5 and RCVA5, slot 56 is connected to XMTB5 and RCVB5, slot 57 is connected to XMTC5 and RCVD5, and slot 58 is connected to XMTD5 and RCVC5. Thus, each tributary interface unit has its own transmit and receive bus segment connections, and the bus segments of the bottom card slots 55–58 are used while top card slots 51–54 remain unused.

DS3 tributary interface group 50 has 1+1 protection (which has previously been described) for the units in slots 53 and 57, and 54 and 58. The units in slots 51 and 55, and 52 and 56, have 1:3 protection. With 1:3 protection, a single protection tributary interface unit can substitute for any of three working tributary interface units should a fault occur in any of the three units.

Interface units whose dimensions are half the height of the tributary group space by two card slots wide, e.g. OC-1, OC-3, or DS3, take up the space of two card slots and may be placed in any of the following pairs of slots illustrated in FIG. 6: 1 and 2, 3 and 4, 5 and 6, and 7 and 8. Thus, four of these tributary interface units may be placed in a single tributary group space. Interface units whose dimensions are half the height of the tributary group space by two card slots wide are not as desirable as the previously described interface units whose dimensions are the full height of the tributary group space by one card slot wide because rather than having each of the slot pairs on a single printed circuit board, each of the slot pairs are on two separate printed circuit boards requiring a connection to pass signals between the two boards.

The bus segments from only one of the card slots of the pair are required to supply each of these interface units. Thus, these units connect only to the bus segments of the right card slots. Alternatively, the units could connect to the bus segments of the left card slots. As a result, each interface unit has a unique set of 8-bit transmit and receive bus segments connecting it with the TSI unit 80.

For example, OC-3 or OC-1 tributary interface group 70 illustrated in FIG. 8 has eight card slots 71–78 and is capable of accepting four DS3, OC-1 or OC-3 tributary interface units. One tributary interface unit may be placed in any of the following pairs of slots 71 and 72, 73 and 74, 75 and 76, and 77 and 78. Eight 8-bit bus segments connect the card slots to the TSI unit 80. Since the bus segments of the right card slot is used in the example, slot 72 is connected to XMTC7 and RCVD7, slot 74 is connected to XMTA7 and RCVA7, slot 76 is connected to XMTB7 and RCVB7, and slot 78 is connected to XMTD7 and RCVC7. Thus, each tributary interface unit has its own transmit and receive bus segment connections, and the bus segments of the right card slots 72, 74, 76, and 78 are used while left card slots 71, 73, 75, and 77 remain unused.

Rather than having the individual card slots share the transmit and receive bus segments, each of the card slots may be given unique connections to the TSI unit 80. However, this design would require a large number of signal connections to the TSI unit 80, additional connection pins, and increased bus interface logic. By having the card slots share bus segments in a manner such that no vertically or horizontally adjacent card slots share the same bus segments, as described above, tributary interface units which are either half the height of the tributary group space by two slots wide or the full height of the tributary group space by one slot wide have unique connections to the TSI unit 80 while the number of signal connections and bus interface logic to the time slot interchange unit is reduced by half.

Tributary interface group 70 uses either 1+1 (which has been previously described) or 1:1 protection. As with 1+1 protection, 1:1 protection requires both a working and a protection tributary interface unit. However, with 1:1 protection, data is only transmitted on the bus segments connected to the working unit. The bus segments connected to the protection unit remain idle until a failure occurs in the working unit.

Interface units whose dimensions are the full height of the tributary group space by two card slots wide, e.g. OC-12, takes up four card slots of the tributary group space; either slots 1, 2, 5, and 6, or slots 3, 4, 7, and 8 may be used. Thus, two of these units may be placed in a single tributary group space. The bus segments from only two of the four card slots are required to supply each of these interface units. Slot pairs 1 and 5, 2 and 6, 3 and 7, and 4 and 8 are each on single printed circuit boards. Thus, in order to reduce the intercircuit board connections, the first interface unit may connect to the bus segments of either card slots 1 and 5, or 2 and 6, and the second interface unit may connect to the bus segments of either card slots 3 and 7, or 4 and 8. Thus, these interface units use groups of two 8-bit bus segments such that each of these units has a unique set of 16-bit transmit and receive bus segments connecting it with the TSI unit 80.

For example, OC-12 tributary interface group 40 illustrated in FIG. 8 is capable of accepting two OC-12 tributary interface units, which may be used for linear add/drop multiplex applications. One OC-12 working unit may be placed in slots 41, 42, 45, and 46, and one OC-12 protection unit may be placed in slots 43, 44, 47, and 48. In this example, the working OC-12 unit uses the bus segments of slots 41 and 45, and the protection OC-12 unit uses the bus segments of slots 43 and 47. The bus segments of slots 42, 46, 44, and 48 are left unused. However, it is to be noted that two sets of bus segments for horizontally adjacent slots, i.e. the used and unused bus segments, may be logically combined into a single bus pair in order to reduce the required bus clock rate for OC-12 units.

Also illustrated in FIG. 8 are two group spaces which are dedicated to a particular interface type. As previously described, each multiplex shelf has one interface group dedicated to the primary OC-12 interface function. In the example illustrated in FIG. 8, interface group 10 having working primary OC-12 unit 11 and protection primary OC-12 unit 12 performs this primary function.

Dedicated DS1 tributary interface group 60 is capable of accepting eight tributary units in slots 61–68. Two 8-bit bus segments, a transmit bus segment XMT6 and a receive bus segment RCV6, connect slots 61–68 to the TSI unit 80. All eight card slots connect to both bus segments XMT6 and RCV6. As with universal DS1 tributary interface group 30, dedicated DS1 tributary interface group 60 has 1:7 protection.

As can be seen from FIG. 8 by comparing DS1 tributary groups 30 and 60, universal tributary groups require more bus segments. Specifically, dedicated DS1 tributary interface group 60 requires two bus segments XMT6 and RCV6, while universal DS1 tributary interface group 30 requires eight bus segments, XMTA3, XMTB3, RCVA3, RCVB3, RCVC3, RCVD3, XMTC3, and XMTD3. However, as is apparent from the present disclosure, universal tributary group spaces of the present invention have many advantages over dedicated group spaces.

By allowing each of the tributary interface units to have separate appropriately sized bus segment connections to the TSI unit 80, 1+1 span protection and unidirectional path switched rings are easily implemented. The TSI unit 80 in both of these cases performs all the data selection and formatting functions associated with the protection process. As a result, this universal interface group approach is inherently fault secure. No single bus or unit fault can disrupt traffic for any 1+1, 1:3, or path switched ring protected unit. For the case of 1:7 DS1 unit protection, if there are four DS1's on a single tributary unit, a maximum of four DS1's could be affected by any single bus-related fault.

The use of unique transmit PCM bus segments also allows the easy implementation of the drop and continue function necessary to interconnect rings at multiple nodes. (A drop and continue function is one in which the data for a tributary enters the ring at one node, but is dropped at multiple nodes.)

Moreover, universal tributary group approach results in significant power savings. The 19.44 Mbit/s (e.g. for DS3 or OC3) and 38.88 Mbit/s (e.g. for OC-12) bus rates are readily implemented with low-power BiCMOS bus logic technology. The 6.48 Mbit/s bus rate (e.g. for DS1) is readily implemented with CMOS bus logic technology. CMOS technology requires less power consumption than BiCMOS or bipolar technologies. Thus, with the universal tributary group approach of the present invention, system power consumption is reduced by matching the bus rate with the data requirements of the tributary interface units, as opposed to COMBUS-type systems where DS1 units must interface to the bus at the same high data rate as the OC-N units, e.g. 19.44 Mbit/s for COMBUS-type systems.

The universal tributary group approach requires far fewer total connections in a pair of vertical slots as compared to the conventional shared bus systems (e.g., in an OC-12 system, only 32 PCM bus signal connections instead of 128). Moreover, since the universal interface group tributary unit sizes are not limited by available connector sizes, as new component technology allows future systems to become more compact, the size of a universal interface group system will be reduced more easily than the conventional COMBUS-type systems.

There has thus been described a novel universal interface group approach for SONET multiplex equipment which fulfills all of the objects and advantages sought therefore. Many changes, modifications, variations and other uses and applications of the subject invention will, however, become apparent to those skilled in the art after considering the specification and accompanying drawings which disclose preferred embodiments thereof. All such changes, modifications, variations and other uses and applications which depart from the spirit and scope of the invention are deemed to be covered by the invention which is limited only by the claims which follow.

What is claimed is:

1. A universal tributary group system for SONET multiplex equipment using tributary interface units, said system comprising:
   an equipment shelf being partitioned into tributary group spaces having slots for holding the tributary interface units;
   each of said slots in said tributary group spaces adapted to receive a tributary unit of any type having a defined mapping into SONET multiplex format;
   a time slot interchange unit located in the equipment shelf; and
   a plurality of bus segments electrically connecting the time slot interchange unit directly with each of the slots of the tributary group spaces, each of said bus segments being provisioned to use a bus rate compatible with the data requirements of the tributary group space it services.

2. The universal tributary group system as claimed in claim 1, wherein horizontally adjacent slots are connected to the time slot interchange unit via different ones of said plurality of bus segments.

3. The universal tributary group system as claimed in claim 1, wherein vertically adjacent slots are connected to the time slot interchange unit via different ones of said plurality of bus segments.

4. The universal tributary group system as claimed in claim 1, further comprising:
   at least one removable card guide to vertically partition at least one tributary group space into at least two rows, so that said at least one tributary group space is adapted to receive tributary units having heights other than the height of the tributary group space;
   wherein said at least one removable card guide is installed or removed without disrupting service to tributary group spaces other than said at least one tributary group space.

5. The universal tributary group system as claimed in claim 4, wherein said at least one removable card guide has permanent fixed vertical supports.

6. The universal tributary group system as claimed in claim 4, wherein said at least one removable card guide has non-permanent fixed vertical supports.

7. The universal tributary group system as claimed in claim 4, wherein said at least one removable card guide does not have vertical supports.

8. The universal tributary group system as claimed in claim 4, wherein the tributary group spaces accept tributary interface units having dimensions selected from the group consisting of: half the height of the tributary group space by one slot, half the height of the tributary group space by two slots, the full height of the tributary group space by one slot, and the full height of the tributary group space by two slots.

9. The universal tributary group system as claimed in claim 1, wherein said bus segments are connected to said slots such that adjacent slots have different bus segment connections to the time slot interchange unit;
   wherein bus segment connections made available for working tributary interface units are unique from bus segment connections made available for protection tributary interface units.

10. The universal tributary group system as claimed in claim 1, wherein the tributary group spaces are four slots wide.

11. The universal tributary group system as claimed in claim 10, further comprising:
   at least one four slot wide removable card guide located in one of said tributary group spaces to vertically partition said one tributary group space into at least two four-slot wide rows.

12. The universal tributary group system as claimed in claim 1, wherein each of said tributary group spaces accepts a mix of types of tributary interface units having bus widths compatible with one another, and having clock rates compatible with one another.

13. The universal tributary group system as claimed in claim 1, wherein the time slot interchange unit comprises means for establishing the bus clock rate for each tributary group space.

14. The universal tributary group system as claimed in claim 1, wherein the time slot interchange unit comprises means for locally performing time-slot assignment/interchange and tributary protection functions.

15. The universal tributary group system as claimed in claim 1, wherein each pair of vertical slots has unique 8-bit transmit bus segments and unique 8-bit receive bus segments connecting each said pair of vertical slots to the time slot interchange unit.

16. The universal tributary group system as claimed in claim 1, wherein adjacent pairs of slots have unique 16-bit transmit bus segments and unique 16-bit receive bus segments connecting said adjacent pairs of slots to the time slot interchange unit.

17. The universal tributary group system as claimed in claim 1, further comprising a clock unit having unique pairs of connections to pairs of adjacent slots.

18. The universal tributary group system as claimed in claim 17, wherein said clock unit comprises a means for selecting a clock signal used to transmit outgoing data from tributary interface units located in the slots, said clock signal selected from the group consisting of: an external clock source, clocks recovered from signals coming in through said tributary interface units, and a local oscillator of the clock unit.

19. The universal tributary group system as claimed in claim 1, wherein said slots in said tributary group spaces share said bus segments, thereby reducing the number of signal connections to the time slot interchange unit; and
   wherein adjacent slots are serviced by different ones of said bus segments such that each pair of adjacent slots has a unique 8-bit transmit bus segment and a unique 8-bit receive bus segment connecting said each pair of adjacent slots to the time slot interchange unit.

20. The universal tributary group system as claimed in claim 1, wherein path switched rings can be implemented by said tributary interface units by connecting said bus segments to said slots such that bus segments servicing working tributary interface units are unique from bus segments servicing protection tributary interface units.

21. The universal tributary group system as claimed in claim 1, wherein one tributary group space is dedicated to a first set of high speed tributary interface units for performing a primary interface function, and another tributary group space is used for either a second set of high speed tributary interface units for performing a linear add/drop multiplex application or any other type of tributary interface unit for performing an application other than the linear add/drop multiplex application.

* * * * *